United States Patent [19]

Pauly

[11] Patent Number: 5,280,245
[45] Date of Patent: Jan. 18, 1994

[54] MAGNETIC RESONANCE APPARATUS EMPLOYING DELAYED SELF-REFOCUSING RF EXCITATION

[75] Inventor: John M. Pauly, Menlo Park, Calif.

[73] Assignee: Board of Trustees of the Leland Stanford Junior Unversity, Stanford, Calif.

[21] Appl. No.: 919,445

[22] Filed: Jul. 27, 1992

[51] Int. Cl.⁵ .............................................. G01V 3/00
[52] U.S. Cl. .................................. 324/307; 324/314
[58] Field of Search ............... 324/307, 308, 309, 311, 324/312, 314

[56] References Cited

U.S. PATENT DOCUMENTS

| | | | |
|---|---|---|---|
| 4,940,940 | 7/1990 | Leroux | 324/309 |
| 4,988,947 | 1/1991 | Ugurbil et al. | 324/307 |
| 5,150,053 | 9/1992 | Pauly et al. | 324/307 |

OTHER PUBLICATIONS

Pauly and Macovski, "Direct Design of Self-Refocusing RF Pulses," Society of Magnetic Resonance in Medicine, Tenth Annual Scientific Meeting, San Francisco, Calif. Aug. 10-16, 1991.

*Primary Examiner*—Louis Arana
*Attorney, Agent, or Firm*—Townsend and Townsend Khourie and Crew

[57] ABSTRACT

MRI Apparatus for obtaining a spin-echo signal applies a self-refocusing RF pulse with variable delay in the spin-echo signals following application of the RF pulse. The RF pulse is designed using the Shinnar-LeRoux algorithm $B_1(t) = SLR^{-1} \{A_n(z), B_n(z)\}$ with $A_n'(z)$ substituted for $A_n(z)$.

$A_n'(z)$ is slightly non-minimum phase and equals $P(z) A_n(z)$ where $P(z)$ is a unit amplitude phase function chosen to compensate the phase of $B_n(z)$. The RF pulse can be designed for a specific delay, a specific power constraint, and small tip angle.

12 Claims, 6 Drawing Sheets

MAGNETIC RESONANCE APPARATUS EMPLOYING DELAYED SELF-REFOCUSING RF EXCITATION

BACKGROUND OF THE INVENTION

This invention relates generally to magnetic resonance imaging (MRI) and spectroscopy, and more particularly the invention relates to self-refocusing RF excitation pulses with variable refocusing delay for use in MRI and spectroscopy.

Magnetic resonance imaging (MRI) is a non-destructive method for the analysis of materials and represents a new approach to medical imaging. It is completely non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Briefly, a strong static magnetic field is employed to line up atoms whose nuclei have an odd number of protons and/or neutrons, that is, have spin angular momentum and a magnetic dipole moment. A second RF magnetic field, applied as a single pulse transverse to the first, is then used to pump energy into these nuclei flipping them over, for example to 90° to 180°. After excitation the nuclei gradually return to alignment with the static field and give up the energy in the form of weak but detectable free induction decay (FID). These FID signals are used by a computer to produce images.

Magnetic field inhomogeneity causes dephasing of nuclear spins after application of an RF excitation. Heretofore, application of a 180° ($\pi$) RF pulse has been used to refocus the spins and create a spin echo.

Self-refocusing excitation pulses can be designed to produce a spin echo at the end of the excitation pulse. See for example Geen and Freeman, "Band Selective Radiofrequency Pulses", Journal of Magnetic Resonance 93, pp. 93–141 (1991). Such band selective pulses can be a single suitably shaped amplitude modulated radiofrequency pulse.

A direct method of synthesizing self-refocusing RF excitation pulses has been developed. See Shinnar et al., "The Synthesis of Pulse Sequences Yielding Arbitrary Magnetization Vectors" Magnetic Resonance in Medicine, 12, pp. 74–80 (1989) and LeRoux "Exact Synthesis of Radiofrequency Waveforms", Proceedings of Seventh SMRM, pg. 1049, August 1988. The Shinnar-LeRoux (SLR) algorithm reduces RF pulse design to the design of two polynomials $A_n(z)$ and $B_n(z)$ where the magnetization $M_{xy}$ produced by an N sample RF pulse is:

$$M_{xy}(X) = 2A_n^*(Z)B_n(Z)$$

where $z =$
$e^{i\gamma G \times T/N}$ and T is the pulse length.

Pauly, LeRoux, Nishimura and Macovski, "Parameter Relations for the Shinnar-LeRoux Selective Excitation Pulse Design Algorithm", IEEE Transactions on Medical Imaging, Vol. 10, No. 1, March 1991 presents a design of $\pi/2$ pulses by choosing $B_n(Z)$ to be a linear phase FIR filter, and $A_n(Z)$ to be the minimum phase polynomial consistent with $B_n(Z)$. This results in a minimum power RF pulse. The RF waveform is the inverse SLR transform $$B_1(t) = SLR^{-1}\{A_n(Z), B_n(Z)\}.$$

A limitation in the known self-refocusing pulse lies in the spin echo occurring only at the end of the RF excitation pulse without a delay, thus eliminating the possibility of applying magnetic gradients prior to reception of the self-refocusing pulse.

SUMMARY OF THE INVENTION

The present invention permits the design and use of a self-refocusing RF excitation pulse in magnetic resonance apparatus with variable delay between the end of the excitation pulse and the spin echo. Further, a minimum SAR can be provided for a selected slice profile.

Briefly, the SLR algorithm is modified by using a slightly non-minimum phase polynomial $A_n'(z) = P(z) A_n(z)$ where $P(z)$ is a unit amplitude phase function chosen to compensate the phase of the linear phase FIR filter, $B_n(z)$. Several phase functions can be designed for $P(z)$ to shift spin echo time.

The invention and objects and features thereof will be more readily apparent from the following detailed description and appended claims when taken with the drawings.

DETAILED DESCRIPTION OF THE ILLUSTRATIVE EMBODIMENTS

Figure 1A:
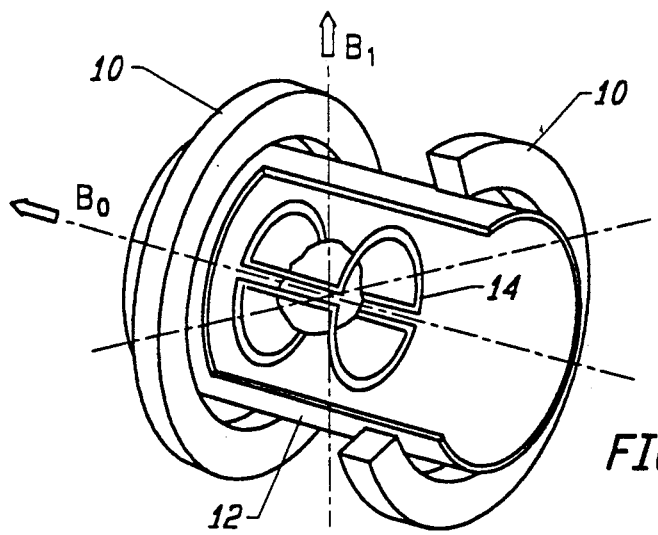
FIGS. 1A–1D illustrate the arrangement of conventional MRI apparatus and magnetic fields generated therein.
Figure 1B:
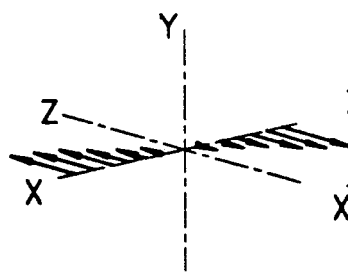
Figure 1C:
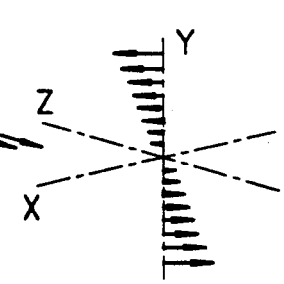
Figure 1D:
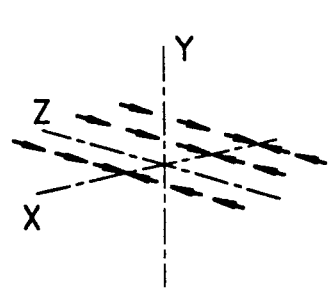

Referring now to the drawings, FIG. 1A is a perspective view partially in section illustrating coil apparatus in an NMR imaging system, and FIGS. 1B–1D illustrate field gradients which can be produced in the apparatus of FIG. 1A. This apparatus is discussed by Hinshaw and Lent, "An Introduction to NMR Imaging: From the Bloch Equation to the Imaging Equation," *Proceedings of the IEEE*, Vol. 71, No. 3, March 1983, pp. 338–350. Briefly, the uniform static field $B_o$ is generated by the magnet comprising the coil pair 10. A gradient field $G_x$ is generated by a complex gradient coil set which can be wound on the cylinder 12. An RF field $B_1$ is generated by a saddle coil 14. A patient undergoing imaging would be positioned along the Z axis within the saddle coil 14.

In FIG. 1B an X gradient field is shown which is parallel to the static field $B_o$ and varies linearly with distance along the X axis but does not vary with distance along the Y and Z axes. FIGS. 1C and 1D are similar representations of the Y gradient and Z gradient fields, respectively.

Figure 2:
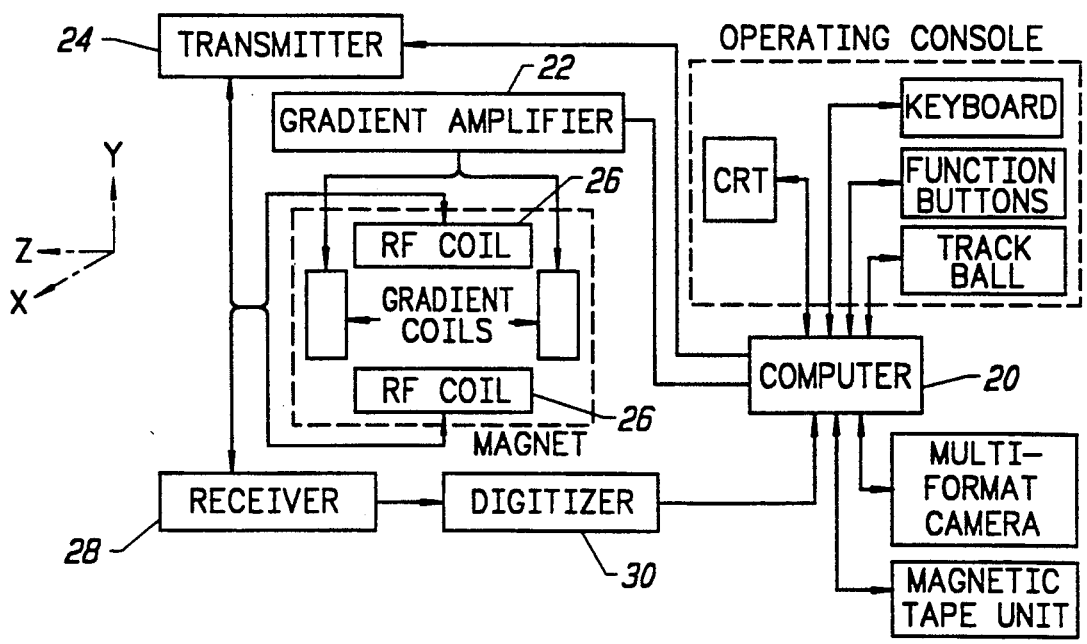
FIG. 2 is a functional block diagram of MRI imaging apparatus.

FIG. 2 is a functional block diagram of the imaging apparatus as disclosed in *NMR-A Perspective on Imaging*, General Electric Company, 1982. A computer 20 is programmed to control the operation of the NMR apparatus and process FID signals detected therefrom. The gradient field is energized by a gradient amplifier 22, and the RF coils for impressing an RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

As described above, magnetic field inhomogeneity causes dephasing of nuclear spins after application of an RF excitation pulse. Heretofore, application of a 180° or $\pi$ RF pulse has been used to refocus dephased spins and create a spin echo. Self-refocusing excitation pulses can be designed to produce a spin echo at the end of the excitation pulse. The Shinnar-LeRoux (SLR) algorithm produces RF pulse design to the design of two polynomials $A_n(z)$ and $B_n(z)$, as described above. $B_n(z)$ is essentially a low pass filter which is designed using digital filter design methods and is usually similar in appearance to the RF pulse. A(z) has a magnitude which is determined by B(z) in accordance with the following equation:

$$|A(z)| = \sqrt{1 - |B(z)|^2}$$

for $z = e^{i\gamma G x t}$, and $\gamma$ is the gyromagnetic ratio which relates the Larmor frequency to field strength, G is the amplitude of the gradient field, x is the spatial position, and t is time.

A minimum phase A (z) results in a minimum power RF pulse. With a minimum power constraint, A(z) is uniquely determined by B(z). In the design of a selective excitation pulse, a low pass filter function is chosen for B(z) which is scaled to $\sin\theta/2$ where $\theta$ is the flip angle. The corresponding minimum phase A(z) is then computed, and the RF pulse then becomes $$\omega_1(t) = SLR^{-1} \{A(z), B(z)\}$$

In accordance with the present invention self-refocusing pulses are designed by starting with a prototype minimum phase RF pulse using the SLR algorithm with refocusing obtained by using a slightly non-minimum phase $A_n^{40}(z) = P(z)A_n(z)$ where P(z) is a unit amplitude phase function chosen to compensate the phase of $B_n(z)$, which can be less than 90° (small tip angle) or greater than 90°. The self-refocusing pulse is then $$B_1(t) = SLR^{-1} \{P(z) A_n(z), B_n(z)\}$$

one possible phase function is of the form $$P(z) = -|z_0|^{-2} \frac{(Z - Z_0)(Z - Z_0^*)}{(Z - 1/Z_0)(Z - 1/Z_0^*)}$$

where $Z_0 = re^{i\Phi}$, and r,$\phi$ are parameters that define locations of poles and zeros of the all-pass filter stage defined by the equation.

This can shift the spin echo time up to two main lobe widths. Larger shifts can be obtained using a product of several such terms. The impulse response of P(z) $A_n(z)$ is evaluated and truncated to produce an FIR filter.

Figure 3A:
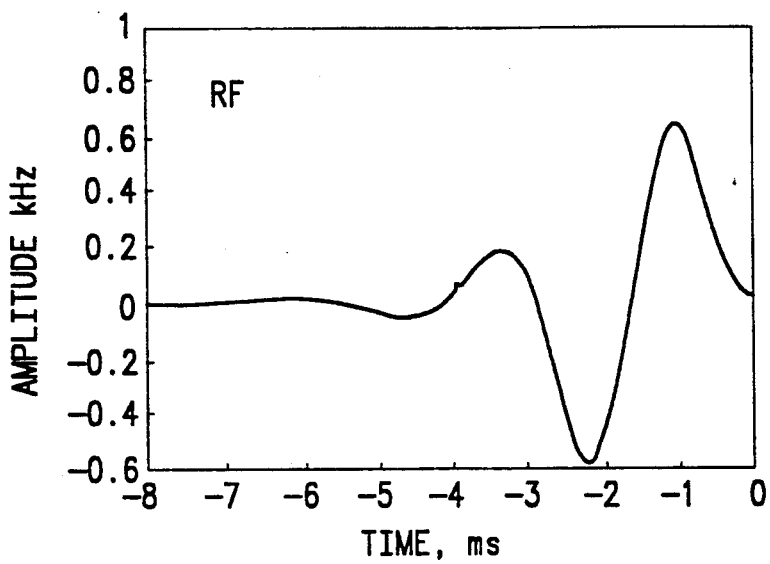
FIGS. 3A–3C illustrate a zero refocusing time pulse in accordance with the SLR algorithm.
Figure 3B:
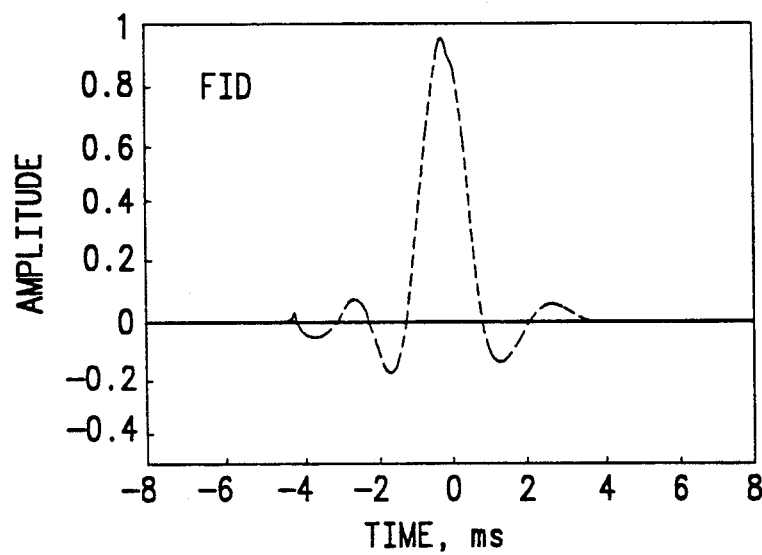
Figure 3C:
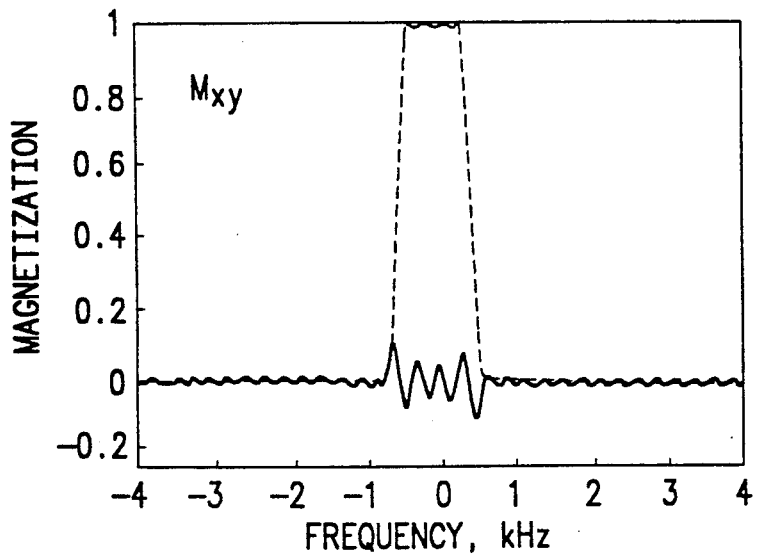
Figure 4A:
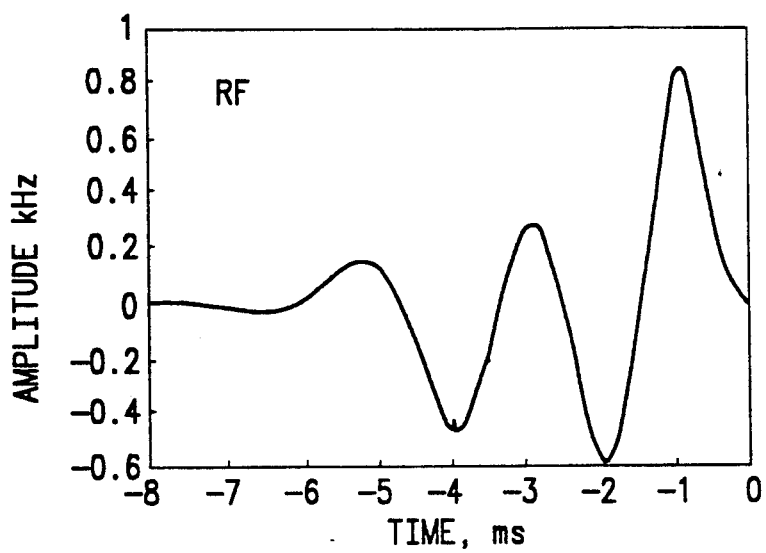
FIGS. 4A–4C illustrate a positive refocusing time pulse with a 1.5 ms echo delay in accordance with one embodiment of the invention.
Figure 4B:
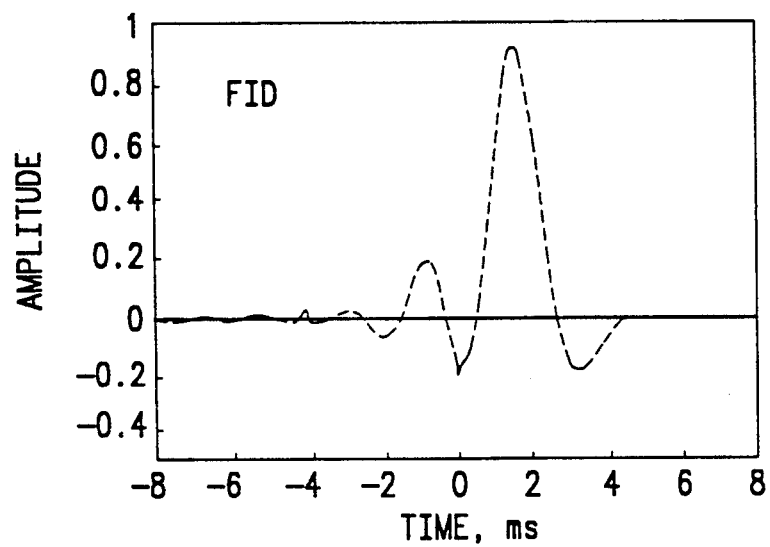
Figure 4C:
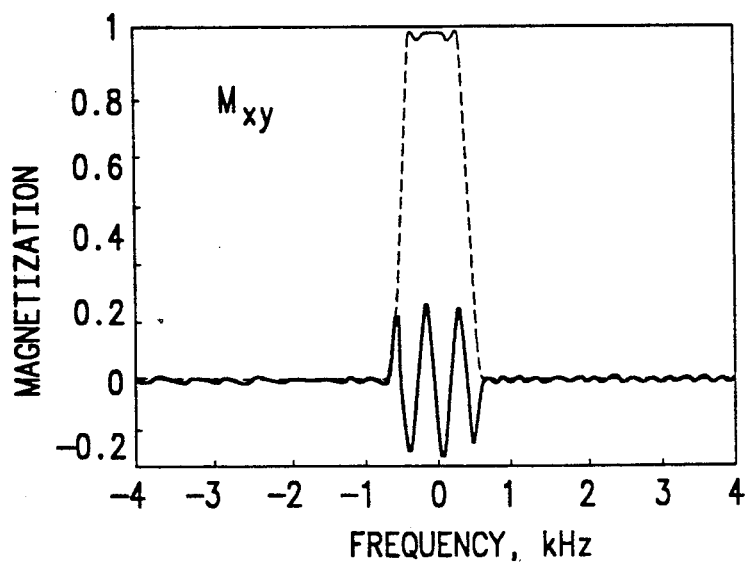

A zero refocusing time pulse is shown in FIGS. 3A-3C. A single P(z) factor is used which is optimized interactively. This pulse is very similar in power to that designed using the SLR algorithm. The SAR is the same as a matched profile $\pi$ pulse. With an additional P(z) factor the spin echo may be delayed, allowing time for gradient ramps or phase encoding lobes. FIGS. 4A-4C illustrate an example of a positive refocusing time pulse with a 1.5 MS echo delay. The SAR is 1.5 times that of a matched profile $\pi$ pulse.

The SAR of an RF pulse is proportional to $(1-a_0)$, where $a_0$ is the zero order coefficient of the $A_n(z)$ polynomial. The prototype minimum phase RF pulse has the minimum SAR for that slice profile. Adding phase compensation increases the SAR proportional to the distance from the $Z_O$ to the unit circle in the complex Z plane. With multiple factors the effect is additive. SAR can be traded off directly against slice profile when designing P(z).

Figure 5:
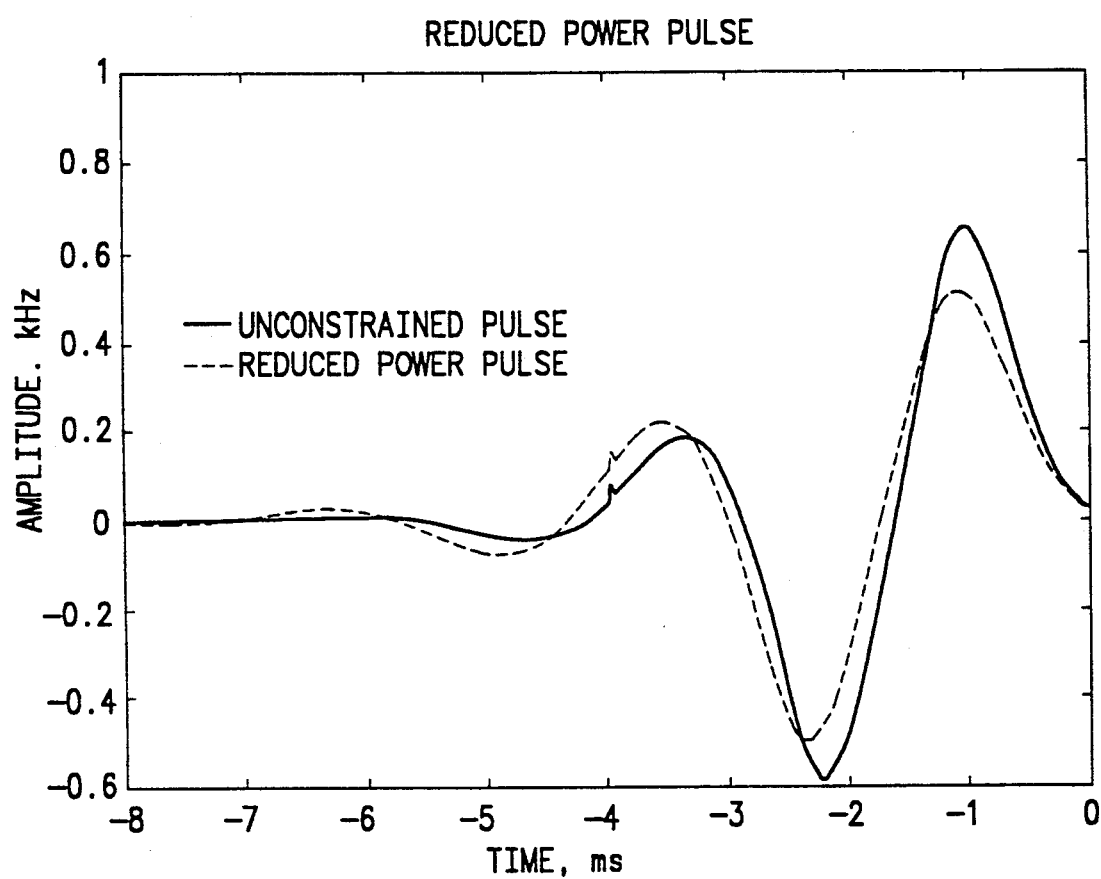
FIG. 5 illustrates the effect of the self-refocusing RF excitation pulse when unconstrained and with reduced power.
Figure 6A:
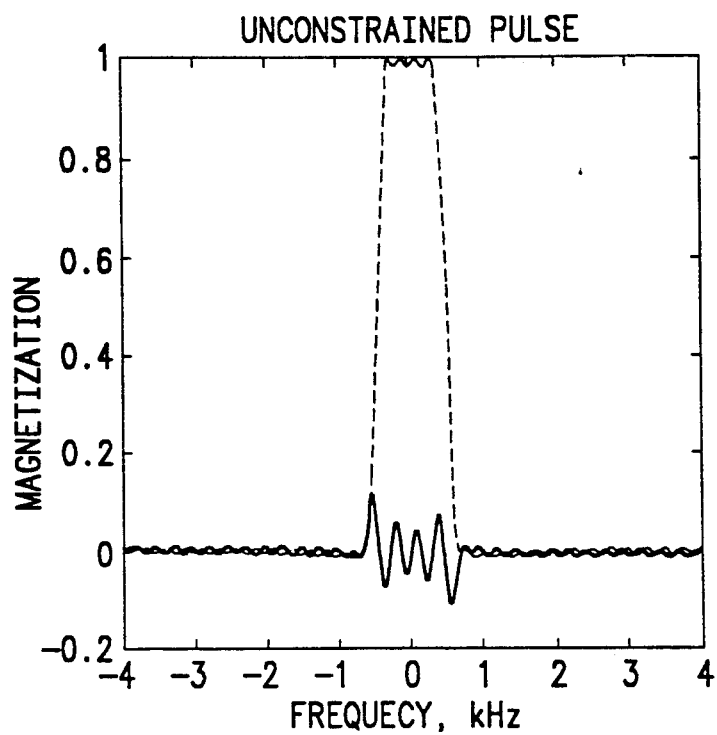
FIGS. 6A and 6B illustrate the magnetization for an unconstrained pulse and the magnetization for a reduced power pulse, respectively.
Figure 6B:
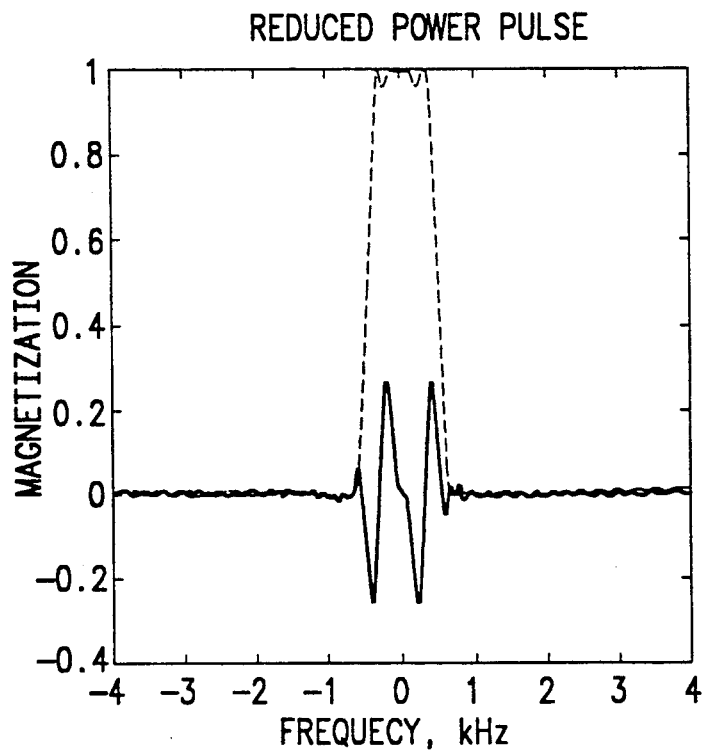
Figure 7:
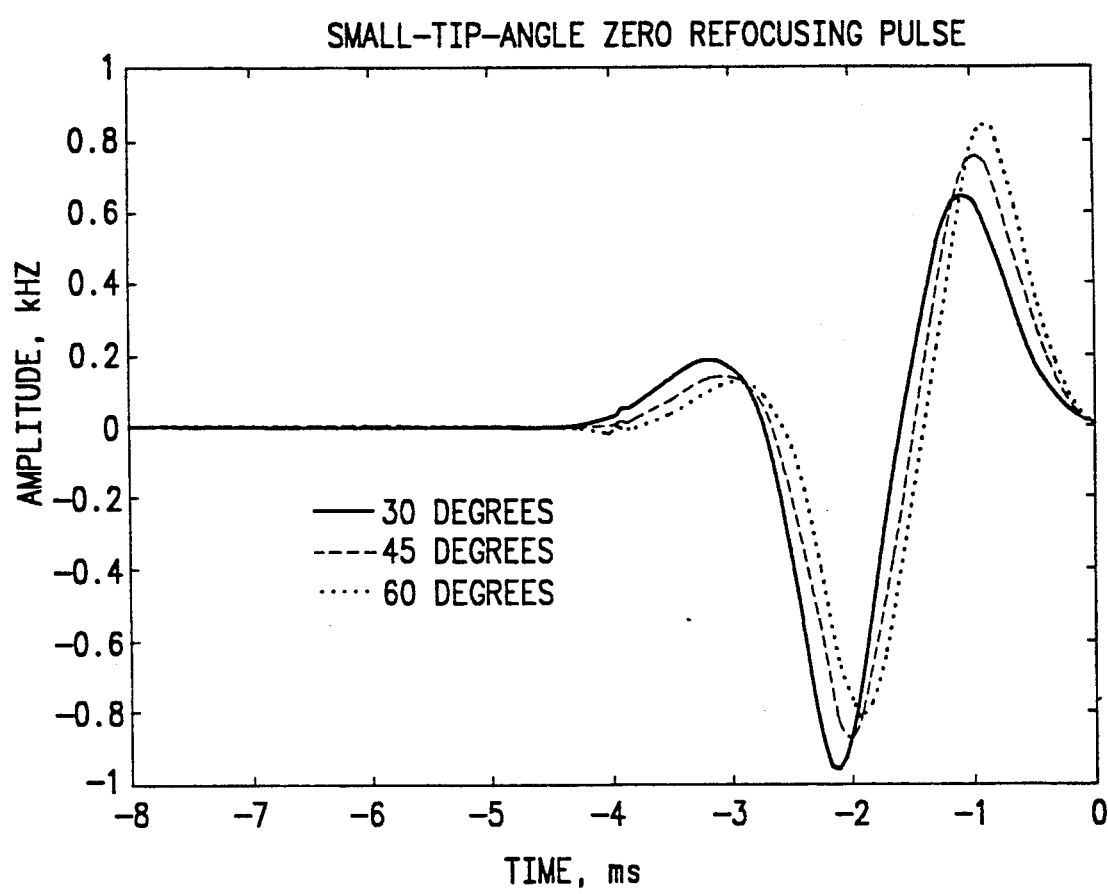
FIG. 7 illustrates several small tip angle zero refocusing pulses.

FIG. 5 is a plot of RF pulses in accordance with the invention illustrating an unconstrained pulse and a reduced power pulse. FIGS. 6A and 6B illustrate the magnetization for an unconstrained pulse and for a reduced power pulse, respectively. By using higher order phase compensation, larger echo delays or sharper profile pulses can be designed. Phase compensation design can be formulated as a linear least squares problem which is directly solvable, and RF power constraint can easily be incorporated therein. The self-refocusing pulses with variable delay in accordance with the invention are designed from a modification of the SLR algorithm for pulse design. The resulting pulses include zero refocusing pulses, delayed refocusing pulses, and small flip angle pulses, as shown in FIG. 7. RF power constraint (SAR) is easily incorporated. $\overline{SAR}$ is linear in $(1-r)$, the distance of poles from the unit circle for a z transform. Flat phase compensation results in $(1-r)$ being large, and high integrated (average) power, $\overline{SAR}$. Conversely, a large phase ripple results in $(1-r)$ being small and lower $\overline{SAR}$. Accordingly, non-linear B(z) must be compensated which restricts design freedom and produces the shift in echo position.

While the invention has been designed with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of exciting a body with RF excitation in MRI apparatus with a self-refocusing spin echo and variable delay following the RF excitation comprising the steps of:

(a) placing said body in a magnetic field ($B_O$), (b) applying an RF excitation pulse, $B_1(t)$, to said body, said excitation pulse being defined as $$B_1(t) = SLR^{-1} \{P(z) A_n(z), B_n(z)\}$$

where
SLR is the Shinnar-LeRoux algorithm
$B_n(z)$ is a polynomial defining an FIR filter
$A_n(z)$ is a minimum phase polynomial consistent with $B_n(z)$
$P(z)$ is a unit amplitude phase function which compensates the phase of $B_n(z)$.

2. The method as defined by claim 1 wherein $$P(z) = -|z_0|^{-2} \frac{(Z - Z_0)(Z - Z_0^*)}{(Z - 1/Z_0)(Z - 1/Z_0^*)}$$

where $Z_o = re^{i\phi}$, and $r, \Phi$ are parameters that define locations of poles and zeros of the all-pass filter stage defined by the equation.

3. The method as defined by claim 1 wherein said excitation pulse has minimum SAR, where SAR is proportional to $(1-a_o)$ and $a_o$ is the zero order coefficient of the $A_n(z)$ polynomial.

4. The method as defined by claim 1 wherein $B_n(z)$ is a polynomial defining a minimum phase FIR filter.

5. The method as defined by claim 1 wherein $B_n(z)$ is scaled to produce a tip angle of less than 90°.

6. The method as defined by claim 1 wherein $B_n(z)$ is scaled to produce a tip angle of greater than 90°.

7. Apparatus for obtaining MRI signals from a body comprising:
    (a) means for establishing a magnetic field ($B_O$) through said body,
    (b) means for exciting said body with an RF excitation pulse, $B_1(t)$, as follows:

$B_1(t) = SLR^{-1} \{P(z) A_n(z), B_n(z)\}$ where
SLR is the Shinnar-LeRoux algorithm
$B_n(z)$ is a polynomial defining an FIR filter
$A_n(z)$ is a minimum phase polynomial consistent with $B_n(z)$
$P(z)$ is a unit amplitude phase function which compensates the phase of $B_n(z)$; and
    (c) means for detecting a spin echo signal from said body following application of said RF excitation pulses.

8. Apparatus as defined by claim 7 wherein $$P(z) = -|z_0|^{-2} \frac{(Z - Z_0)(Z - Z_0^*)}{(Z - 1/Z_0)(Z - 1/Z_0^*)}$$

where $Z_o = re^{i\phi}$, and $r, \Phi$ are parameters that define locations of poles and zeros of the all-pass filter stage defined by the equation.

9. Apparatus as defined by claim 7 wherein said excitation pulse has minimum SAR, where SAR is proportional to $(1-a_o)$ and $a_o$ is the zero order coefficient of the $A_n(z)$ polynomial.

10. Apparatus as defined by claim 7 wherein $B_n(z)$ is a polynomial defining a minimum phase FIR filter.

11. Apparatus as defined by claim 7 wherein $B_n(z)$ is scaled to produce a tip angle of less than 90°.

12. Apparatus as defined by claim 7 wherein $B_n(z)$ is scaled to produce a tip angle of greater than 90°.

* * * * *